Figure 1:
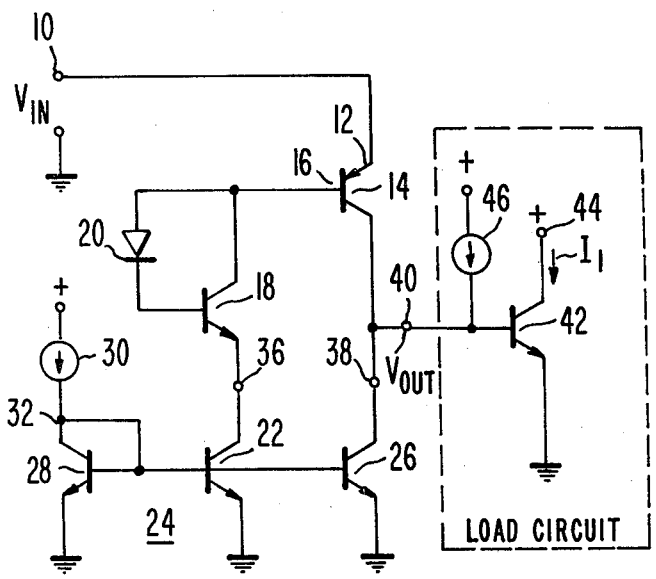

United States Patent [19]

Ahmed

[11] 4,221,979
[45] Sep. 9, 1980

[54] NON-INVERTING BUFFER CIRCUITS
[75] Inventor: Adel A. A. Ahmed, Annandale, N.J.
[73] Assignee: RCA Corporation, New York, N.Y.
[21] Appl. No.: 858,810
[22] Filed: Dec. 8, 1977
[51] Int. Cl.$^2$ .................... H03K 17/60; H03K 3/26
[52] U.S. Cl. ............................... 307/255; 307/263; 307/296 R; 307/299 A
[58] Field of Search ............... 307/296, 303, 263, 363, 307/255, 299 B; 330/257, 261, 288

[56] References Cited
U.S. PATENT DOCUMENTS

| | | | |
|---|---|---|---|
| 3,626,313 | 12/1971 | Zuk ................................... | 307/303 |
| 3,628,064 | 12/1971 | Camenzind ......................... | 307/264 |
| 4,122,402 | 10/1978 | Main .................................. | 330/288 |

Primary Examiner—Stanley D. Miller, Jr.
Assistant Examiner—B. P. Davis
Attorney, Agent, or Firm—P. J. Rasmussen; A. L. Limberg; A. J. Jacobson

[57] ABSTRACT

An input signal to a buffer circuit is applied via the emitter-to-base junction of a transistor to a circuit which includes at least one additional semiconductor junction and a current source. The collector of the transistor connects to a second current source and to the buffer circuit output terminal. When the input signal exceeds a threshold value, determined by the number of semiconductor junctions in the circuit including the emitter-to-base junction, the transistor turns on and its collector current, which exceeds the capacity of the second current source, flows via the buffer circuit output terminal to the load circuit.

8 Claims, 4 Drawing Figures

NON-INVERTING BUFFER CIRCUITS

The present invention relates to buffer circuits.

There are many applications in which it is desired to receive a voltage at one level and to produce in response thereto, an output at a second voltage level. In one particular application, of present interest, the input signal represents a binary digit and the buffer is required to translate the signal voltage to a current at a low voltage level. The buffer is also required to have a high input impedance, to have a sharp threshold at a level to distinguish a 1 from a 0 level and sufficiently high to provide good noise immunity, and it is also required to tolerate, without damage, relatively large voltage excursions at the input terminal to the buffer.

Circuits embodying the present invention satisfy the requirements discussed above.

In the drawing:

FIGS. 1, 2, 3 and 4 are circuit diagrams of four embodiments of the present invention.

Similar reference numerals are employed in the various figures to identify similar parts.

Referring first to FIG. 1, an input signal representing a binary digit is applied between input terminal 10 and a point of reference potential, shown as ground. The signal may be a voltage produced by a complementary-symmetry-metal-oxide-semiconductor (COS/MOS) logic circuit or one produced by a so-called transistor, transistor logic (T²L) circuit and, ideally, will have a voltage of several volts such as five volts when it respresents a 1 and will have a value of zero volts when it respresents a 0. Input terminal 10 connects to the emitter electrode 12 of PNP transistor 14. The base 16 of this transistor connects to the collector electrode of NPN transistor 18. A semiconductor junction, comprising diode 20, is connected in the forward direction relative to the base current flow through transistor 18 between the collector and base of transistor 18. The emitter of transistor 18 connects to a current source illustrated as the output transistor 22 of a current mirror amplifier (CMA) 24. The collector of transistor 14 connects to a second current source comprising the output transistor 26 of the CMA. The input circuit of the CMA 24 comprises a diode-connected NPN transistor 28 which receives, at its common collector-base connection, the current from a current source 30. The input terminal 32 of the current mirror amplifier is at this common base-collector connection and the two output terminals 36 and 38 are at the collectors of transistors 22 and 26, respectively. The emitters of the CMA transistors are connected to a point of reference potential, shown as ground, which comprises the common terminal of the CMA.

The output terminal 40 of the buffer circuit is at the connection of collector 26 of transistor 14 to the collector of transistor 26. This output terminal connects to a load circuit, shown as a current mode logic stage by way of example, only a portion of this stage being illustrated. This stage, known colloquially as I²L, comprises an NPN transistor 42 connected at its emitter to a point of reference potential and at its collector to terminal 44 to which a current $I_1$ is applied. The circuit also includes a current source 46 which supplies a current to the base 42 of the transistor.

In the operation of the circuit of FIG. 1, the source 30 supplies, for example, a current of the order of 50 microamperes (μA) to the input terminal 32 of the current mirror amplifier. In general, the current source 46 supplies an equal amount of current. The transistors 28, 22 and 26 of the CMA are assumed to have the same base-emitter junction areas so that the output transistors 22 and 26 attempt to draw the same amount of collector current flow (50 μA) as flows into the input terminal 32 of the CMA. Assume transistor 14 to be off so that it supplies none of the current demand of transistor 26. As source 46 supplies 50 μA, this current flows substantially entirely into the output terminal 38 of the CMA so that insufficient current remains to flow into the base of transistor 42 and transistor 42 is off. Accordingly, no collector current flows in transistor 42.

Looking from input terminal 10 through the current path leading to output terminal 36 of the CMA, there are three semiconductor junctions connected essentially in series. The first junction comprises the emitter-to-base junction of transistor 14, the second comprises the diode 20, and the third comprises the base-emitter junction of NPN transistor 18. So long as the input signal voltage is lower than $+3V_{BE}$ (where $V_{BE}$ is the threshold voltage of a semiconductor junction), no current will flow from the input terminal through the path just described. Thus, even though the collector of transistor 22 is demanding current, none is available to satisfy this need and substantially no collector current flows in transistor 22.

When the input voltage exceeds $+3V_{BE}$, current flows through the base-emitter junction of transistor 14 and through diode 20 and the base-emitter junction of transistor 18 to the output terminal 36 of the CMA. This current turns on transistors 18 and 22 and output current flows through the output transistor 22 of the CMA. This output current, when it flows, will not exceed 50 μA as the input current to the CMA provided by source 30 is 50 μA and transistor 22 has the same base-emitter junction area as transistor 28. Assuming this current to be equal to 50 μA, and recalling that the emitter-to-base current flow through transistor 14 turns this transistor on, collector current will flow through transistor 14. The amount of collector current flow will be equal to $\beta$ (the current amplification factor of transistor 14) multiplied by the base current flow, which is assumed to be 50 μA. PNP transistor 14 may have a $\beta$ of say from 10 to 25 or so, depending upon its structure, so that there is many times the collector current available than the output terminal 38 of the CMA can accept. This current, therefore, flows into the base of output transistor 42, turning on this transistor. This switches the circuit from a condition representing a 0 in which transistor 42 draws no collector current to a condition representing a 1 in which transistor 42 is on and is drawing collector current. Thus, the circuit of FIG. 1 operates as a non-inverting buffer circuit.

The circuit of FIG. 1 has a number of important operating advantages. First, while the input voltage may swing in value from zero to say five volts or so, the output signal available at terminal 40 swings in value between much smaller limits, namely between zero volts and $1V_{BE}$. The output signal, as a matter of fact, comprises a current at a low voltage level compatible with the I²L logic circuit input signal requirement. A second feature of the circuit is that no B+ supply is required for the transistors of the buffer stage. Another feature of the circuit is that it is tolerant to reasonable swings of input voltage. For example, input swings to $+10$ volts cause no damage to the circuit.

While for purposes of illustration the circuit of FIG. 1 has been shown to have a threshold of $3V_{BE}$, it should be evident that with circuit modification, the threshold can be changed. For example, it can be reduced by reducing the number of semiconductor junctions connected between the base 16 of transistor 14 and the output terminal 36 and the threshold can be increased by increasing the number of essentially series-connected semiconductor junctions. Moreover, while in this particular example the voltage dropping elements are illustrated as forward biased semiconductor junctions, alternatives are possible. As one example, one or more zener diodes may be employed in the circuit between the base 16 and output terminal 36 for obtaining a desired threshold voltage level.

The table below illustrates the performance of an embodiment of FIG. 1 which was operated. In this particular circuit the current $I_1$ was measured at the collector of transistor 42. The convention was employed that a current $I_1$ of 45 microamperes or more represented a binary 1 and the current of lower value than this a binary 0. This transition occurs at an input voltage between of 1.59 and 1.60 volts. An advantage of the circuit is its high sensitivity near the circuit threshold, that is, the relatively large changes in $V_{OUT}$ and $I_1$ which occur in response to the relatively small incremental input voltage $V_{IN}$ changes (0.01 volt).

It may be observed, in passing, that the relatively low value of about 1.6 volts for $3V_{BE}$ is due to the small amount of current which flows through the base-emitter junctions in the path between emitter 12 and terminal 36. At values of current this low, $1V_{BE}$ may be of the order of between 0.5 volts and 0.55 volts, with the $V_{BE}$ of transistor 18 being smaller than the $V_{BE}$ of transistor 14 since transistor 18 conducts only a fraction of the collector current of transistor 14, namely $1/\beta_{14}$, where $\beta_{14}$ is the forward current gain of transistor 14. Diode 20 exhibits a $V_{BE}$ that is smaller yet than the $V_{BE}$ of transistor 18, the difference corresponding with the fact that diode 20 conducts a current that is $1/\beta_{18}$ of the collector current of transistor 18, where $\beta_{18}$ is the forward current gain of transistor 18. (It is known that the difference between two $V_{BE}$'s of transistors of like geometries is given by $$\Delta V_{BE} = \frac{kT}{\nu} \ln \frac{I_1}{I_2}$$

where
$I_1$ = emitter current of one transistor
$I_2$ = emitter current of other transistor
$\Delta V_{BE}$ = difference between $V_{BE}$'s
T = absolute temperature in °Kelvin
$\nu$ = charge on an electron in coulombs
k = Boltzmann's constant.
At room temperature, T = 300° K. and $kT/\nu = 0.026$ V.)

TABLE

| VOLTS $V_{IN}$ | VOLTS $V_{OUT}$ | mA $I_1$ |
|---|---|---|
| 1.50 | .05 | .0000 |
| . | . . | |
| . | . | .0000 |
| . | . | |
| 1.55 | .136 | .0000 |
| 1.56 | .243 | .0000 |
| 1.57 | .386 | .0001 |

TABLE-continued

| VOLTS $V_{IN}$ | VOLTS $V_{OUT}$ | mA $I_1$ |
|---|---|---|
| 1.58 | .520 | .006 |
| 1.59 | .582 | .036 |
| 1.60 | .608 | .093 |
| 1.61 | .625 | .153 |
| 1.62 | .638 | .216 |

In the circuit of FIG. 1, when the buffer circuit is on it draws an amount of current equal at maximum to $\beta I_{36}$, where $I_{36}$ is the output current of the CMA. In this particular circuit $I_{36} = I_{46}$, where $I_{46}$ is the current employed internal of the I²L gate circuit for operating the transistors of the I²L gate circuit. The current available at terminal 10 is limited and in one particular design was 1 ma, maximum.

Figure 2:
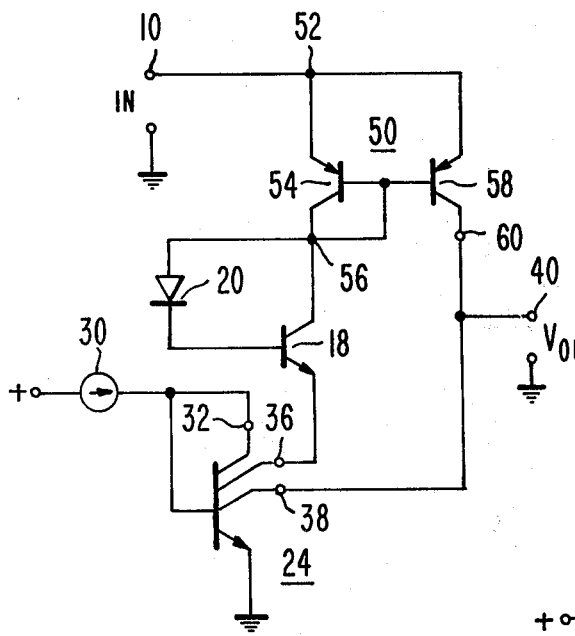

FIG. 2 illustrates a circuit which is similar to the FIG. 1 circuit; however, rather than requiring an input current such as indicated above, it employs instead an input current equal to $2I_{36}$. The modification of the circuit is to employ a current mirror amplifier 50 at the input to the buffer rather than a transistor 14. The CMA 50 is connected at its common terminal 52 to the input terminal 10. The input transistor 54 of the CMA 50, which comprises a PNP transistor connected at its base to its collector, is connected at its input terminal 56 to a common connection at the anode of diode 20 and the collector of transistor 18. The output transistor 58 of the CMA is connected at its output terminal 60 to the output terminal 40 of the buffer. The load circuit, not shown, can be similar to the one of FIG. 1. The CMA 24 is functionally the same as the CMA 24 of FIG. 1; however, it is illustrated to show, in a schematic way, how the CMA actually may be implemented. In other words, CMA 24 is illustrated to show that there may be a common P-type base region and a common N-type emitter region. CMA 50 may likewise be implemented in this manner.

The operation of the circuit of FIG. 2 is, in general, similar to that of FIG. 1. However, in the FIG. 2 circuit, as the input current to the CMA 50 is constrained to be equal to the current demand at the output terminal 36 of the CMA 24, the output current of the CMA 50 at output terminal 60 is also constrained to this same value. It is assumed here that the gain of CMA 50 = −1, i.e., that transistors 54 and 58 of the CMA have equal base-emitter junction areas. If it is assumed that as in FIG. 1, the current supplied by source 30 is 50 μA, then the current demand at terminals 36 and 38 will be 50 μA and transistor 58 will supply 50 μA whenever the input signal at 10 exceeds the $3V_{BE}$ threshold. This current satisfies the demand at terminal 38 so that the source 46 (see FIG. 1) within the load circuit turns on the output transistor 42. The total current drawn from input terminal 10 is 100 μA in this example rather than $\beta \times 50$ μA as in FIG. 1, so that the power dissipation in the circuit of FIG. 2 is substantially lower than that of FIG. 1.

Figure 3:
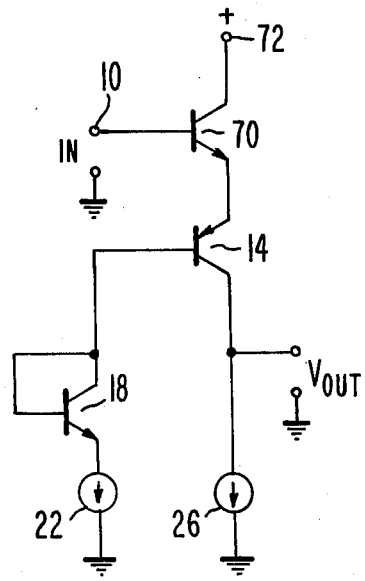

FIG. 3 illustrates another modification of the circuit of FIG. 1. Here, the input signal is applied to the base of an NPN transistor 70. This transistor is connected at its emitter electrode to the emitter electrode of PNP transistor 14 and at its collector electrode to terminal 72 to which a positive supply voltage is applied. The current sources 22 and 26 of FIG. 1 are illustrated in a more general way in FIG. 3 than in the previous figures, it being understood that each such source demands the same amount of current which, in this example, may be 50 μA just as in the case of FIG. 1. Transistor 70 introduces a forward-biased junction drop into the circuit threshold; however, this is cancelled by omitting diode 20 from the base-to-collector connection of transistor 18. This restores the desired $3V_{BE}$ threshold.

In the operation of the circuit of FIG. 3, the input current required from terminal 10 when the input signal exceeds the $3V_{BE}$ threshold, will be equal to the current demand of current source 22 multiplied by $\beta_{14}/\beta_{70}$. As this circuit can be designed to make $\beta_{70}$ much higher than $\beta_{14}$, the input current requirement can be made much lower than the current demand of source 26.

Figure 4:
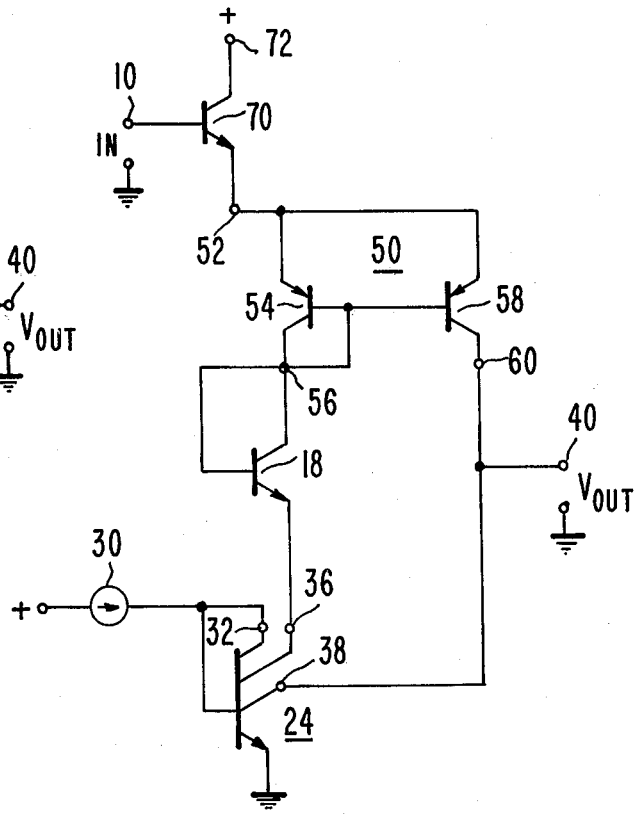

FIG. 4 illustrates another modification of the circuit of FIG. 2. Here, as in the circuit of FIG. 3, the input signal is applied to the base of an NPN transistor 70. This transistor is connected at its emitter electrode to the common terminal 52 of CMA 50 and at its collector electrode to terminal 72 to which a positive supply voltage is applied.

In the operation of the circuit of FIG. 4, the input current required from terminal 10 when the input signal exceeds the $3V_{BE}$ will be equal to the current demand of current source 22 multiplied by $2/\beta_{70}$. As the minimum value of $\beta_{70}$ is a parameter that is usually specified and well controlled in monolithic integrated circuits, the maximum value of the input current required from terminal 10 will be predictable to close tolerances in manufacturing. However, both the circuits of FIG. 3 and FIG. 4 do require a B+ voltage at 72 to supply the collector current of transistor 70 so that this transistor will produce sufficient emitter current to satisfy the emitter current demand of transistor 14, or of CMA 50, respectively. The other two circuits illustrated do not require such a B+ voltage. The circuits of FIG. 3 and FIG. 4 are useful in those applications where adequate B+ power is available but where it is important to reduce to a very small value the signal current withdrawn from input terminal 10.

What is claimed is:

1. A buffer circuit comprising, in combination:
   an input transistor having emitter, base and collector electrodes, and an emitter-to-base junction;
   a circuit input terminal coupled to said emitter electode;
   a first current source;
   means, responsive to current flow through said means, for establishing a voltage at a particular level across said means, said means and said first current source connected in series between said base electrode and a point of reference potential;
   a second current source connected between said collector electrode and said point of reference potential; and
   a circuit output terminal at said collector electrode.

2. A buffer circuit as set forth in claim 1, wherein said means responsive to current flow comprises at least one semiconductor junction poled in the forward direction relative to current flow through said emitter-to-base junction.

3. A buffer circuit as set fourth in claim 2, wherein said means responsive to current flow further comprises a second transistor of opposite conductivity type than the first-mentioned transistor, said second transistor having a collector-base junction connected across said one semiconductor junction, and an emitter electrode connected to said first current source, the base-to-emitter junction of said second transistor being poled to receive current in the forward direction relative to the current flow through said one semiconductor junction.

4. A buffer circuit as set forth in claim 1, further including a current mirror amplifier (CMA), said input transistor comprising the CMA output transistor, said CMA also including a CMA input transistor of the same conductivity type as said CMA output transistor, and having an emitter electrode connected to the emitter electrode of said CMA output transistor and having base and collector electrodes connected to the base electrode of said CMA output transistor.

5. A buffer circuit as set fourth in claim 1, further including another transistor of opposite conductivity type than said input transistor, said another transistor having a base-emitter junction serving to couple said input terminal to said emitter electrode of said input transistor, said base-emitter junction being connected at its base to said input terminal and at its emitter to said emitter electrode of said input transistor, and said another transistor having a collector electrode connected to a terminal for an operating voltage.

6. A buffer circuit as set forth in claim 1, further including a load circuit comprising an output transistor of opposite conductivity type than said input transistor, having a base electrode connected to said output terminal, an emitter electrode connected to said point of reference potential, and a collector electrode connected to an operating current terminal, and a current source coupled to said base electrode of said output transistor for supplying base current to said output transistor.

7. A buffer circuit as set forth in claim 4, further including another transistor of opposite conductivity type than said input transistor, said another transistor having a base-emitter junction serving to couple said input terminal to said emitter electrode of said input transistor, said base-emitter junction being connected at its base to said input terminal and at its emitter to said emitter electrode of said input transistor, and said another transistor having a collector electrode connected to a terminal for an operating voltage.

8. A buffer circuit as set forth in claim 1, further including a current mirror amplifier (CMA) having a common terminal connected to said point of reference potential, an input terminal and first and second output terminals, said CMA including first, second and third transistors of opposite conductivity type than said input transistor, each having base, emitter and collector electrodes, all of said emitter electrodes connected to said common terminal, the collector and base electrodes of said first transistor being connected to said CMA input terminal and to the base electrode of said second and third transistors, the collector electrode of said second transistor being connected to said first CMA output terminal, and the collector electrode of said third transistor being connected to said second CMA output terminal, and a third current connected to said CMA input terminal, said second transistor serving as said first current source and said third transistor serving as said second current source.

* * * * *